United States Patent
Chen et al.

(10) Patent No.: US 6,667,926 B1
(45) Date of Patent: Dec. 23, 2003

(54) MEMORY READ/WRITE ARBITRATION METHOD

(75) Inventors: Yi-Hung Chen, Yilan (TW); Ming-Hsien Lee, Hsinchu (TW); Chia-Hsien Chou, Hsinchu (TW); Tsan-Hwi Chen, Hsinchu (TW); Te-Lin Ping, Taoyuan (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 0 days.

(21) Appl. No.: 10/236,955

(22) Filed: Sep. 9, 2002

(51) Int. Cl.[7] .................................................. G11C 7/00
(52) U.S. Cl. ........................................ 365/221; 711/147
(58) Field of Search .......................... 365/221, 189.01; 711/100, 147, 154; 710/100

(56) References Cited

U.S. PATENT DOCUMENTS

| | | | | |
|---|---|---|---|---|
| 6,499,077 B1 | * | 12/2002 | Abramson et al. | 710/305 |
| 2002/0090006 A1 | * | 7/2002 | Chang et al. | 370/471 |
| 2003/0093630 A1 | * | 5/2003 | Richard et al. | 711/154 |

* cited by examiner

Primary Examiner—Michael S. Lebentritt
Assistant Examiner—Nam Nguyen
(74) Attorney, Agent, or Firm—Sughrue Mion, PLLC

(57) ABSTRACT

A memory read/write arbitration method is disclosed. The memory read/write arbitration method, which is utilized in a memory controller for increasing row hit rate and decreasing the delay of memory access, comprises: providing a arbitrator; providing a read request fifo queue having command read requests; providing a write request fifo queue having command write requests; performing a judgment step for generating a priority, wherein the judgment step comprises: performing a first sub-judgment step to determine that a command read request of the command read requests has priority over a command write request of the command write requests, or the command write request can be forwarded to a second sub-judgment step under adaptive first-step conditions; performing the second sub-judgment step to determine the read request has priority over the command write request from the first sub-judgment step, or the command write request from the first sub-judgment has priority over the command read request. Therefore, by the memory read/write arbitration method of the present invention, the row hit rate and the bandwidth utilization of memory module are increased through the applied judgment step.

14 Claims, 4 Drawing Sheets

MEMORY READ/WRITE ARBITRATION METHOD

FIELD OF THE INVENTION

The present invention relates to a memory read/write arbitration method, and more particularly relates to a memory read/write arbitration method utilized in a memory controller for increasing row hit rate and decreasing the delay of memory access.

BACKGROUND OF THE INVENTION

Please referring to FIG. 1, FIG. 1 is a diagram showing a conventional structure of personal computer system. As shown in FIG. 1, there are a process unit 10, a host bridge module 12 connected with a memory module 14 and a display device 16 (such as an AGP device) through a memory bus 18 and an AGP bus 20 respectively, and a south bridge module 22 connected with the host bridge module 12 through a PCI bus 24. The process unit 10 accesses the memory module 14 through a host bus 26, the host bridge module 12 and the memory bus 18, and there are PCI devices 28 accessing the memory module 14 through the PCI bus 24, the host bridge module 12 and the memory bus 18.

Inside the host bridge module 12, there is a memory controller 30 embedded, wherein the embedded memory controller 30, which is used to interface the process unit 10 and the memory bus 18, comprises: an IOQ, at least one read request FIFO queue (Rfifo queue), at least one write request FIFO queue (Wfifo queue), and at least one memory arbitrator.

Please referring to FIG. 2, FIG. 2 is a diagram showing a conventional arbitration structure of memory controller according to FIG. 1. As shown in FIG. 2, the Rfifo queue 50 comprises N+1 read entries 54 (N+1 command read requests) and the Wfifo queue 52 comprises M+1 write entries 56 (M+1 command write requests), wherein N and M are integers equal to or greater than zero. A plurality of comparators 58 are used for comparing the associated address of each read entry 54 of the Rfifo queue 50 to that of each write entry 56 of the Wfifo queue 52.

For example, when the front read entry 54 of the Rfifo queue 50 is scheduled to be forwarded to a memory arbitrator 60, the associated address of the front read entry 62 is compared to that of each valid write entry 56. If there is a match in the i write entry of the Wfifo queue 52, this front read entry 62 will be suspended until all the write entries prior to the i write entry and also the i write entry have forwarded to the memory arbitrator 60. If the associated address of each write entry 56 does not match that of the front read entry 62, this front read entry 62 will be forwarded to the memory arbitrator 60. In the computer architecture, this operation for reducing the read latency is known as the read around write operation. On the other hand, the front read entry 62 in the Rfifo queue 50 will not be forwarded to the memory arbitrator 60 when a match comes.

Under the read around write operation, the Wfifo queue 52 gets priority over the Rfifo queue 50 when the Rfifo queue 50 is empty or an associated data fifo (not shown) of the Rfifo queue 50 is full, wherein the associated data fifo is used to save the temporary responses of read requests.

Please also refer to FIG. 1. Since the process unit 10 is eager to get data from memory module 14 for process, designers always concern about how to speed up the read cycle, the retrieval of the data from the memory module 14 and how to reduce the read latency, so that the read around write operation is widely utilized to let the Rfifo queue 50 frequently has priority over the Wfifo queue 52. However, as long as the write cycles are issued from the process unit 10 and completed in the host bus 26, it is not so much concerned that when or how fast the write cycles are forwarded and completed in the memory bus 18. Thus, the utilization of memory bus 18 is decreased apparently, and the row hit rate is polluted and decreased by breaking consecutive same type entries, since the row hit probability among either consecutive same type read entries or consecutive same type write entries is considerably high under the read around write operation.

SUMMARY OF THE INVENTION

In view of the background of the invention described above, since how to speed up the read cycle, the retrieval of the data from the memory module and how to reduce the read latency are concentrated principally, the conventional memory read/write arbitration method just serves the higher priority for the Rfifo queue than for the Wfifo queue in read around write operation. Therefore, the row hit is polluted and decreased by breaking consecutive same type entries, and moreover, the utilization of memory bus is decreased, and the frequency of accessing delay during the transitions from read to write and from write to read is increased obviously.

It is the principal object of the present invention to provide a memory read/write arbitration method. In the present invention, the memory read/write arbitration method performs a judgment on the Rfifo queue and the Wfifo queue. Two judgment steps are applied in the memory read/write arbitration method. A first sub-judgment step is used to evaluate whether the command write request of Wfifo queue can be forwarded to a second sub-judgment step or not by preset adaptive conditions, such as whether the number of command write requests is equal to or greater than the high threshold to the number of command write requests, and whether the pending number of command read requests is less than the low threshold to the pending number of command read requests, etc. The second sub-judgment step is used to evaluate if the command write request from the first sub-judgment step has the priority over the command read request of Rfifo queue, or if the command read request of Rfifo queue has the priority over the command write request from the first sub-judgment step under preset adaptive conditions, such as if the number of continuous command write requests is under the low threshold to the number of continuous command write requests, or between the high threshold to the number of continuous command write requests and the low threshold to the number of continuous command write requests, and meanwhile, the page address accessed by current command write request is equal to the page address opened by accesses of a plurality of command write requests and command read requests previously.

In accordance with the aforementioned purpose of the present invention, the present invention provides a memory read/write arbitration method for increasing the row hit rate and the bandwidth utilization of memory bus. The memory read/write arbitration method comprises: providing a arbitrator; providing a read request fifo queue having a plurality of command read requests; providing a write request fifo queue having a plurality of command write requests; performing a judgment step to determine if a command write request of the plurality of command write requests has priority over a command read request of the plurality of command read requests to be forwarded, or if the command read request of the plurality of command read requests has priority over the command write request of the plurality of command write requests to be forwarded, wherein the judgment step comprises: performing a first sub-judgment step to obtain a signal Cmd_Wrt_Req_Mask, and the command read request has priority over the command write request to be forwarded when the signal Cmd_Wrt_Req_Mask is enabled, and otherwise, the command write request is forwarded to be performed in a second sub-judgment step when the signal Cmd_Wrt_Req_Mask is disabled under at least one of a plurality of first-step conditions, such as that the number of command write requests is equal to or greater than the high threshold to the number of command write requests, that the pending number of command read requests is less than the low threshold to the pending number of command read requests, and etc; and performing the second sub-judgment step with the command write requests from the first sub-judgment step and the command read requests to obtain a signal Mem_Gnt_Wrt_Window, and the command read request has priority over the command write request to be forwarded when the signal Mem_Gnt_Wrt_Window is not enabled, and otherwise, the command write request has priority over the command read request to be forwarded when the signal Mem_Gnt_Wrt_Window is enabled under a plurality of second-step conditions, such as that the number of continuous command write requests is under the low threshold to the number of continuous command write requests, or between the high threshold to the number of continuous command write requests and the low threshold to the number of continuous command write requests, and meanwhile, the page address accessed by current command write request is equal to the page address opened by accesses of a plurality of command write requests and command read requests previously.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Since certain row hit rate is kept among read cycle and the row miss rate is increased among write cycle under the read around write operation, a certain tenure for the Wfifo queue is required to be protected when the Wfifo queue gets the priority over the Rfifo queue. Therefore, in order to increase the row hit rate, the present invention provides a memory read/write arbitration method to reduce the row hit pollution.

Figure 1:
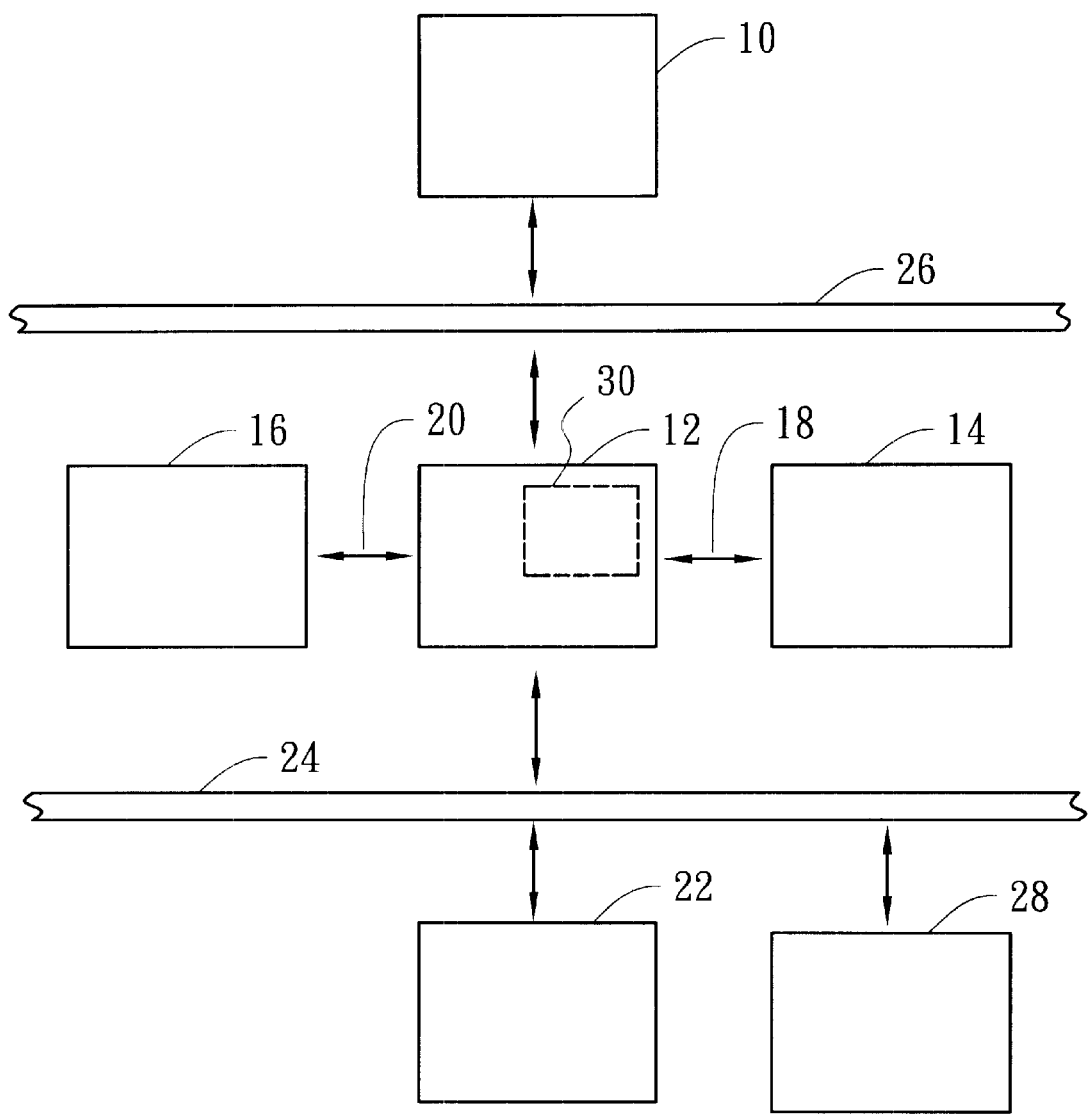
FIG. 1 is a diagram showing a conventional structure of personal computer system.
Figure 2:
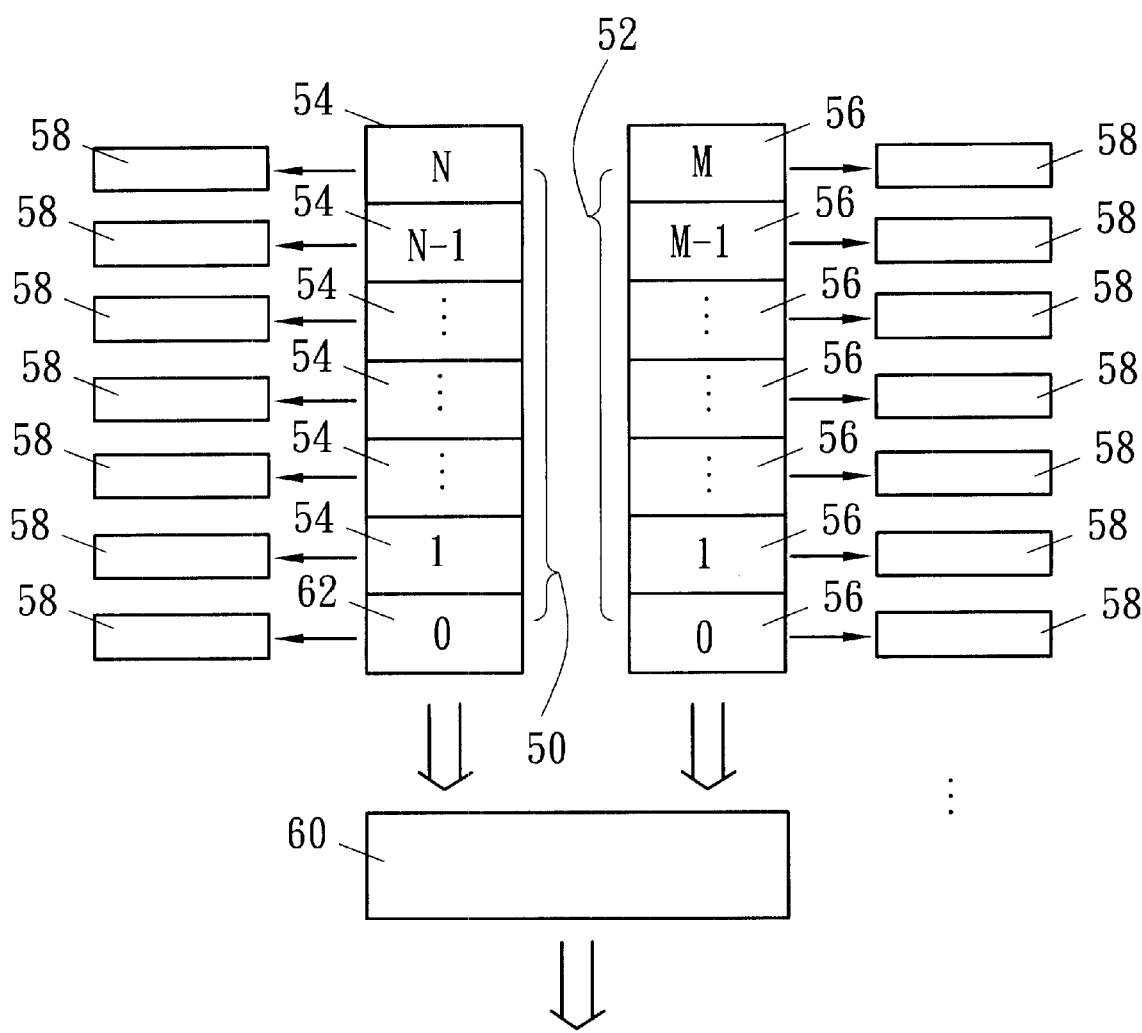
FIG. 2 is a diagram showing a conventional arbitration structure of memory controller according to FIG. 1.
Figure 3:
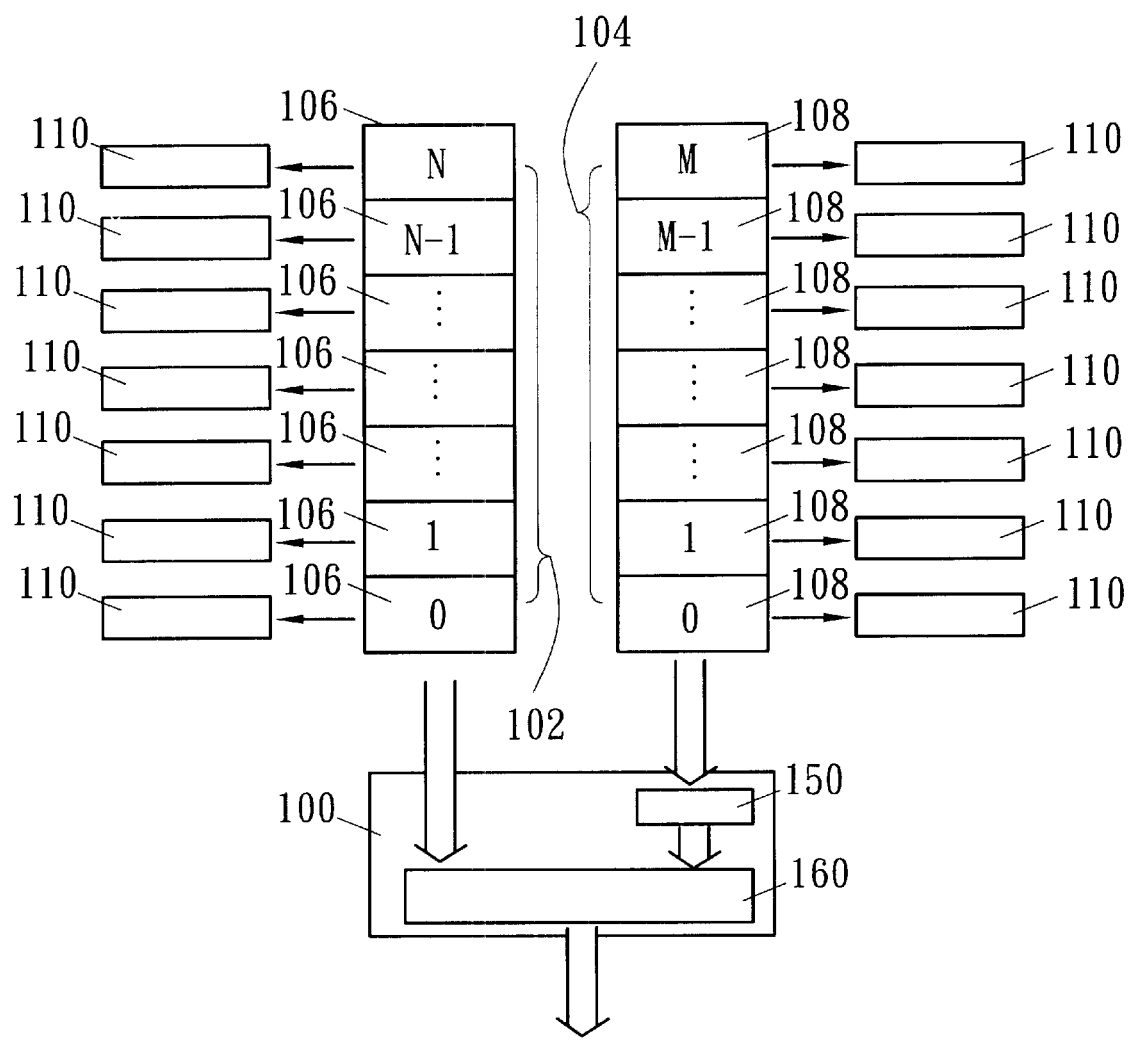
FIG. 3 is a diagram showing a preferred embodiment of an arbitration structure of memory controller according to the present invention.

Please referring to FIG. 3, FIG. 3 is a diagram showing a preferred embodiment of an arbitration structure of memory controller in the present invention. As shown in FIG. 3, there are a Rfifo queue 102 and a Wfifo queue 104 entering a memory arbitrator 100 in sequence, respectively, wherein the Rfifo queue 102 comprises a lot of command read requests 106, and the Wfifo queue 104 comprises a lot of command write requests 108. In the memory read/write arbitration method provided by the present invention, a plurality of parameters have to be declared and preset first. The parameters are described as follows.

CmdWrt_Req_Cnt: a parameter used to record the number of command write requests 108.

Wrt_Req_Cnt_High_Threshold: a high threshold to the number of command write requests 108.

CmdRd_Req_Pend_Cnt: a parameter used to record the pending number of command read requests 106.

CmdRd_Req_Low_Threshold: a low threshold to the pending number of command read requests 106.

CmdRd_Req_Idle_Timer: a parameter used to count and record the idle time of Rfifo queue 102 when there is no command read request 106 in the Rfifo queue 102.

CmdRd_Req_Idle_Time_Threshold: a threshold to the idle time of Rfifo queue 102.

CmdRd_Line_Hit: a parameter used to monitor a plurality of different read hit signals, such as general read hit signal, graphic read hit signal and gart table read hit signal.

Continuous_CmdWrt_Number: a parameter used to record the number of continuous command write requests 108.

Continuous_CmdWrt_High_Threshold: a high threshold to the number of continuous command write requests 108.

Continuous_CmdWrt_Low_Threshold: a low threshold to the number of continuous command write requests 108.

Page_Addr(Current CmdWrt_Req): a page address accessed by current command write request 108.

Page_Addr(Opened): a page address opened by accesses of a plurality of command write requests 108 and command read requests 106 previously.

The memory read/write arbitration method provided by the present invention consists of a first sub-judgment step and a second sub-judgment step, wherein the first sub-judgment step is used to arbitrate whether the command write requests 108 in the Wfifo queue 104 can be forwarded to the second sub-judgment step for asking priority or not, and the second sub-judgment step is used to arbitrate that the higher priority is obtained by command read request 106 or command write request 108. Either command read request 106 or command write request 108 can be forwarded to other following processes after the priority is judged in the second sub-judgment step.

Figure 4:
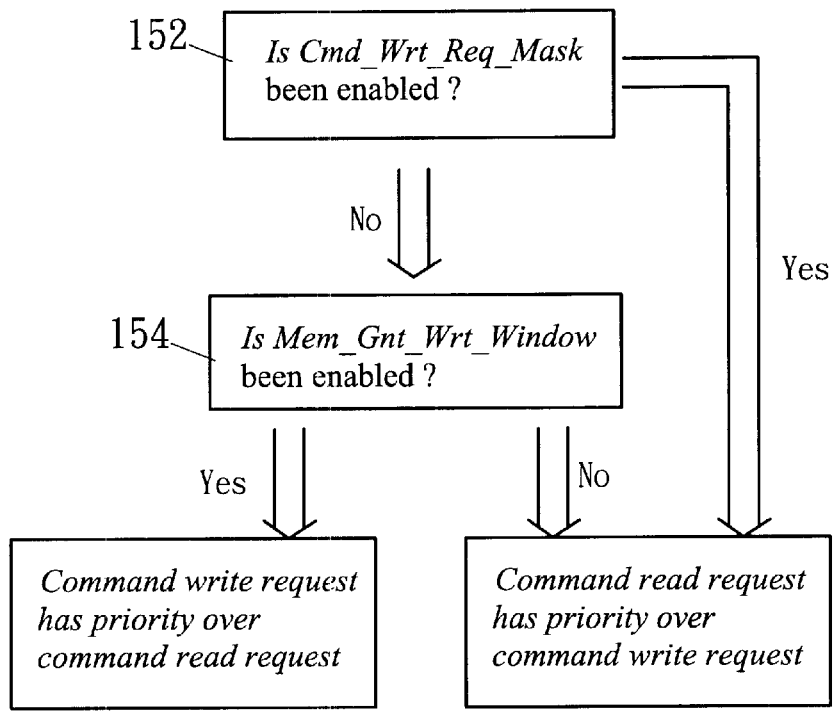
FIG. 4 is a flow sheet showing the operation of the memory read/write arbitration method according to the present invention.

Please referring to FIG. 3 and FIG. 4, FIG. 4 is a flow sheet showing the operation of the memory read/write arbitration method provided by the present invention. In the first sub-judgment step 152, a mask window 150 is applied and is controlled by a signal Cmd_Wrt_Req_Mask. If the Cmd_Wrt_Req_Mask is disabled, the mask window 150 is opened, and then the command write requests 108 in the Wfifo queue 104 can be forwarded to a second sub-judgment step 154. Oppositely, if the Cmd_Wrt_Req_Mask is enabled, the mask window 150 is closed, so that the command write requests 108 in the Wfifo queue 104 are stopped forwarding to the second sub-judgment step 154, and thus the command read requests 106 have priority over the command write requests 108.

The Cmd_Wrt_Req_Mask is disabled under at least one of four first-step conditions established, wherein those four first-step conditions are:

I. CmdWrt_Req_Cnt≧Wrt_Req_Cnt_High_Threshold—the parameter that records the number of command write requests 108 is equal to or greater than the preset adaptive high threshold to the number of command write requests 108;

II. CmdRd_Req_Pend_Cnt<CmdRd_Req_Low_Threshold—the parameter that records the pending number of command read requests 106 is less than the preset adaptive low threshold to the pending number of command read requests 106;

III. CmdRd_Req_Idle_Timer>CmdRd_Req_Idle_Time_Threshold—the parameter that counts and records an idle time of Rfifo queue 102 is over a threshold to the idle time of Rfifo queue 102; and IV. CmdRd_Line_Hit is active.

According to the first-step condition I, in order to avoid the overflow of waiting command write requests 108 when the read request owns higher priority continuously, an adaptive Wrt_Req_Cnt_High Threshold is preset first. In case the Wrt_Req_Cnt_High_Threshold is preset to four entries, the Cmd_Wrt_Req_Mask is disabled and the mask window 150 is opened when the CmdWrt_Req_Cnt reaches four or is greater than four.

According to the first-step condition II, in order to increase the utilization of bandwidth and enhance the memory accessing performance when the command read requests 106 in the Rfifo are nearly empty, an adaptive CmdRd_Req_Low_Threshold needs to be preset first. In case the CmdRd_Req_Low_Threshold is preset to three entries, the Cmd_Wrt_Req_Mask is disabled and the mask window 150 is opened when the CmdRd_Req_Pend_Cnt is less than three.

On the other hand, if the command write requests 108 are designed to be forwarded to the second sub-judgment step 154 in a period after all command read requests 106 have passed the memory arbitrator 100, according to the first-step condition III, the CmdRd_Req_Idle_Time_Threshold has to be preset first, and moreover, the CmdRd_Req_Idle_Timer starts to count and record the idle time of Rfifo queue 102 when there is no command read request 106 in the Rfifo queue 102. For example, if the CmdRd_Req_Idle_Time_Threshold is preset to twelve memory clocks, the Cmd_Wrt_Req_Mask is disabled and the mask window 150 is opened when the idle time of Rfifo queue 102 is over twelve memory clocks, which means that CmdRd_Req_Idle_Timer>CmdRd_Req_Idle_Time_Threshold.

According to the first-step condition IV, sometimes command write request 108 must be forwarded before the command read request 106, such as general read hit, graphic read hit, and gart table read hit, etc., so the CmdRd_Line_Hit is provided and applied. If the aforementioned read hit (general read hit, graphic read hit, and gart table read hit, etc) occurs, the CmdRd_Line_Hit is active, and then the Cmd_Wrt_Req_Mask is disabled and the mask window 150 is opened.

Depending on circuit design, the aforementioned four first-step conditions for determining whether the mask window 150 is open or not can be implemented in different combinations, such as a combination of condition I, condition III and condition IV, a combination of condition I, condition II and condition IV, a combination of condition I, condition II, condition III and condition IV, and etc.

In the second sub-judgment step 154, a write grant protection window 160 is applied and is controlled by a signal Mem_Gnt_Wrt_Window. If the Mem_Gnt_Wrt_Window is enabled, the write grant protection window 160 is opened, and then the command write request 108 through the mask window 150 has higher priority over the command read request 106, so that the command write request 108 through the mask window 150 can keep on being forwarded to the memory module. Oppositely, if the Mem_Gnt_Wrt_Window is disabled, the write grant protection window 160 is closed, the command read request 106 in Rfifo queue 102 has higher priority over the command write request 108, and meanwhile the command write request 108 through the mask window 150 is stopped forwarding.

The Mem_Gnt_Wrt_Window is enabled under either one of second-step conditions, wherein the second-step conditions are:

I. Continuous_CmdWrt_Low_Threshold<Continuous_CmdWrt_Number<Continuous_CmdWrt_High_Threshold and Page_Addr (Current CmdWrt_Req)==Page_Addr(Opened)—the parameter that records the number of continuous command write requests 108 is between the high threshold to the number of continuous command write requests 108 and the low threshold to the number of continuous command write requests 108, and meanwhile, the page address accessed by current command write request 108 is equal to the page address opened by accesses of a plurality of command write requests 108 and command read requests 106 previously; and II. Continuous_CmdWrt_Number<Continuous_CmdWrt_Low_Threshold—the parameter that records the number of continuous command write requests 108 is less than the low threshold to the number of continuous command write requests 108.

Obviously, the value of Continuous_CmdWrt_High_Threshold means that the number of continuous write accesses can be tolerated between two neighboring read accesses. According to the second-step condition I and the second-step condition II, the Continuous_CmdWrt_Number is limited to the range between the Continuous_CmdWrt_High_Threshold and the Continuous_CmdWrt_Low_Threshold, or to the range under the Continuous_CmdWrt_Low_Threshold when the command write request 108 through the mask window 150 has higher priority over the command read request 106. Moreover, in order to increase row hit rate and decrease the accessing delay during read to write transition and write to read transition, the Continuous_CmdWrt_Number is not only required between the Continuous_CmdWrt_High_Threshold and the Continuous_CmdWrt_Low_Threshold, but the page address accessed by current command write request 108 needs to be equal to the page address opened by accesses of a plurality of command write requests 108 and command read requests 106 previously, which also can be executed by comparators 110, and the command write request 108 from the first sub-judgment step 152 has priority over the command read request 106 thereafter. In other words, when the Continuous_CmdWrt_Number is greater than the Continuous_CmdWrt_High_Threshold, the command read request 106 is sure to have priority over the command write request 108 from the first sub-judgment step 152. Therefore, the bandwidth and the accessing order distribution of read request and write request can be executed effectively.

Because discrete small number of accumulated continuous command write requests 108 is harmful to the efficiency of command read requests 106, and the read to write transition turn around time and write to read transition turn around time hurts the accessing efficiency obviously, the write grant protection window 160 has to be utilized and executed in order to normalize the number of continuous write requests 108, so as to decrease the accessing delay during read to write transition and write to read transition, and to increase the row hit rate.

When the priority of the command read request 106 and command write request 108 is judged in memory arbitrator 100, there are two principles for reference in conclusion:

I. Command read request 106 (or Rfifo queue 102) always owns higher priority than command write request 108 (or Wfifo queue 104) when Cmd_Wrt_Req_Mask is enabled or Mem_Gnt_Wrt_Window is disabled.

II. Command write request 108 (or Wfifo queue 104) owns higher priority than command read request 106 (or Rfifo queue 102) when Cmd_Wrt_Req_Mask is disabled and Mem_Gnt_Wrt_Window are enabled.

Another optional principle is that command write request 108 owns higher priority than command read request 106 when a parameter CmdWrt_CmdQueue_Nearly_Full is enabled, wherein the parameter CmdWrt_CmdQueue_Nearly_Full is used to indicate whether the Wfifo queue 104 is near full or not. When the Wfifo queue 104 is near full, the CmdWrt_CmdQueue_Nearly_Full is enabled.

Figure 5:
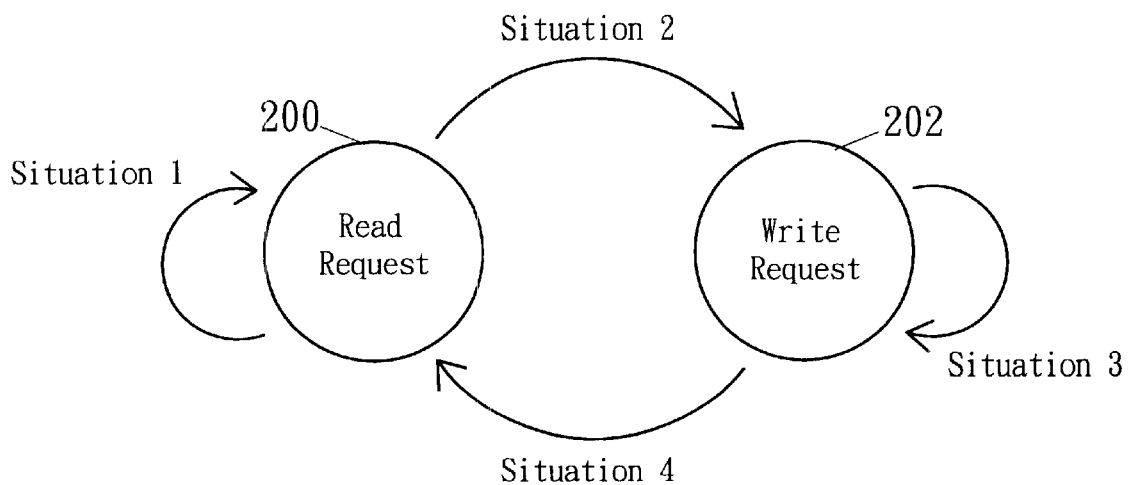
FIG. 5 is a diagram showing the priority judgment between read request and write request according to the present invention.

Please referring to FIG. 5, FIG. 5 is a diagram showing the priority judgment between read request 200 and write request 202, wherein the priority judgment between read request 200 and write request 202 is determined by four situations listed as follows.

situation 1.—When read request 200 owns higher priority than write request 202 at the moment, and then read request 200 owns higher priority than write request 202 continuously if there are read requests 200 in Rfifo queue and the CmdWrt_CmdQueue_Nearly_Full is disabled;

situation 2.—When read request 200 owns higher priority than write request 202 at the moment, but write request 202 owns higher priority than read request 200 later if the CmdWrt_CmdQueue_Nearly_Full is enabled, or there are write requests 202 in Wfifo queue and there is no any read request 200 in Rfifo queue;

situation 3.—When write request 202 owns higher priority than read request 200 at the moment, and then write request 202 owns higher priority than read request 200 continuously if Cmd_Wrt_Req_Mask is disabled and Mem_Gnt_Wrt_Window is enabled or the CmdWrt_CmdQueue_Nearly_Full is enabled; and situation 4.—When write request 202 owns higher priority than read request 200 at the moment, but read request 200 owns higher priority than write request 202 later if the CmdWrt_CmdQueue_Nearly_Full is disabled, or Cmd_Wrt_Req_Mask is enabled, or Mem_Gnt_Wrt_Window is disabled.

The traditional arbitration method is just to serve higher priority of the Rfifo than of the Wfifo, but the memory read/write arbitration method provided by the present invention supports a priority judgment between Rfifo queue and Wfifo queue. In the memory read/write arbitration method of the present invention, either the first step or the second step can be implemented individually, or both of the first step and second step are implemented in sequence as described above for more row hit and more utilization efficiency on bandwidth. Moreover, a training mechanism can be applied to fine turn all the options in the memory read/write arbitration method of the present invention. The training principles comprise:

(1) To decrease the specified value of the CmdRd_Req_Low_Threshold or the specified size of write grant protection window 160 if the idle length in a command bus increases.

(2) Using the moving average number to be the pending number of command read requests 106 when read request is inactive.

The advantage of the present invention is to provide a memory read/write arbitration method, and more particularly relates to a memory read/write arbitration method utilized in a memory controller for increasing row hit rate and decreasing the delay of memory access. Compared to the conventional design, the present invention supports an effective method and apparatus on decreasing the read to write transition turn around times and write to read transition turn around times, which are harmful to the inherit row hit rate dramatically. Therefore the row hit rate is increased, and the bandwidth and accessing order distribution of read request and write request can be arbitrated and performed effectively.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A memory read/write arbitration method utilized in a memory controller, comprising:

providing an arbitrator;

providing a read request fifo queue having a plurality of command read requests;

providing a write request fifo queue having a plurality of command write requests;

performing a judgment step to determine that a command write request of the plurality of command write requests has priority over a command read request of the plurality of command read requests to be forwarded or the command read request of the plurality of command read requests has priority over the command write request of the plurality of command write requests to be forwarded, wherein the judgment step comprises:

performing a first sub-judgment step to obtain a signal Cmd_Wrt_Req_Mask, and the command read request has priority over the command write request to be forwarded when the signal Cmd_Wrt_Req_Mask is enabled, and otherwise, the command write request is forwarded to be performed a second sub-judgment step when the signal Cmd_Wrt_Req_Mask is not enabled under at least one of a plurality of first-step conditions; and performing the second sub-judgment step with the command write requests from the first sub-judgment step and the command read requests to obtain a signal Mem_Gnt_Wrt_Window, and the command read request has priority over the command write request to be forwarded when the signal Mem_Gnt_Wrt_Window is not enabled, and otherwise, the command write request from the first sub-judgment method has priority over the command read request to be forwarded when the signal Mem_Gnt_Wrt_Window is enabled under one of a plurality of second-step conditions.

2. The memory read/write arbitration method of claim 1, wherein the plurality of first-step conditions comprise:
  I. $CmdWrt\_Req\_Cnt \geq Wrt\_Req\_Cnt\_High\_Threshold$, wherein a parameter CmdWrt_Req_Cnt is used to records a number of the plurality of command write requests, and a parameter Wrt_Req_Cnt_High_Threshold is a high threshold to the number of the plurality of command write requests;
  II. $CmdRd\_Req\_Pend\_Cnt < CmdRd\_Req\_Low\_Threshold$, wherein a parameter CmdRd_Req_Pend_Cnt is used to record a pending number of the plurality of command read requests, and a parameter CmdRd_Req_Low_Threshold is a low threshold to the pending number of the plurality of command read requests;
  III. $CmdRd\_Req\_Idle\_Timer > CmdRd\_Req\_Idle\_Time\_Threshold$, wherein a parameter CmdRd_Req_Idle_Timer is used to count and record an idle time of the read request fifo queue, and a parameter CmdRd_Req_Idle_Time_Threshold is a threshold to the idle time of the read request fifo queue; and
  IV. CmdRd_Line_Hit is active, wherein a signal CmdRd_Line_Hit is used to monitor a plurality of read hit signals, and when the plurality of read hit signals occur, the signal CmdRd_Line_Hit is active.

3. The memory read/write arbitration method of claim 2, wherein the plurality of read hit signals comprise at least one general read hit, at least one graphic read hit, and at least one gart table read hit.

4. The memory read/write arbitration method of claim 1, wherein the plurality of second-step conditions comprise:
  I. $Continuous\_CmdWrt\_Low\_Threshold < Continuous\_CmdWrt\_Number < Continuous\_CmdWrt\_High\_Threshold$ and $Page\_Addr(Current\ CmdWrt\_Req) == Page\_Addr(Opened)$, wherein a parameter Continuous_CmdWrt_Number is used to record a number of a plurality of continuous command write requests in the plurality of command write requests, and a parameter Continuous_CmdWrt_High_Threshold is a high threshold to the number of the plurality of continuous command write requests, and a parameter Continuous_CmdWrt_Low_Threshold is a low threshold to the number of the plurality of continuous command write requests, and a parameter Page_Addr(Current CmdWrt_Req) is a page address accessed by a current command write request in the plurality of command write requests, and a parameter Page_Addr(Opened) is a page address opened by accesses of the plurality of command write requests and the plurality of command read requests previously; and
  II. $Continuous\_CmdWrt\_Number < Continuous\_CmdWrt\_Low\_Threshold$.

5. The memory read/write arbitration method of claim 1, wherein the judgment step further comprises performing a queue-checking step to determine that the command write request has priority over the command read request to be forwarded when the write request fifo queue is near full, and if the write request fifo queue is not near full, to perform the first sub-judgment step continuously.

6. The memory read/write arbitration method of claim 1, wherein further comprises performing a training step after performing the second sub-judgment step, and the training step comprises:
  I. To decrease the value of the parameter CmdRd_Req_Low_Threshold if an idle length in a command bus increases; and
  II. Using a moving average number to be the parameter CmdRd_Req_Pend_Cnt when the plurality of command read requests are inactive.

7. A memory read/write arbitration method utilized in a memory controller, comprising:
  providing an arbitrator;
  providing a read request fifo queue having a plurality of command read requests;
  providing a write request fifo queue having a plurality of command write requests;
  performing a judgment step to determine that a command write request of the plurality of command write requests has priority over a command read request of the plurality of command read requests to be forwarded or the command read request of the plurality of command read requests has priority over the command write request of the plurality of command write requests to be forwarded, wherein the judgment step comprises:
    performing a first sub-judgment step to obtain a signal Cmd_Wrt_Req_Mask, and the command read request has priority over the command write request to be forwarded when the signal Cmd_Wrt_Req_Mask is enabled, and otherwise, the command write request is forwarded to be performed a second sub-judgment step when the signal Cmd_Wrt_Req_Mask is not enabled under at least one of a plurality of first-step conditions that comprise:
      I. $CmdWrt\_Req\_Cnt \geq Wrt\_Req\_Cnt\_High\_Threshold$, wherein a parameter CmdWrt_Req_Cnt is used to records a number of the plurality of command write requests, and a parameter Wrt_Req_Cnt_High_Threshold is a high threshold to the number of the plurality of command write requests;
      II. $CmdRd\_Req\_Pend\_Cnt < CmdRd\_Req\_Low\_Threshold$, wherein a parameter CmdRd_Req_Pend_Cnt is used to record a pending number of the plurality of command read requests, and a parameter CmdRd_Req_Low_Threshold is a low threshold to the pending number of the plurality of command read requests;
      III. $CmdRd\_Req\_Idle\_Timer > CmdRd\_Req\_Idle\_Time\_Threshold$, wherein a parameter CmdRd_Req_Idle_Timer is used to count and record an idle time of the read request fifo queue, and a parameter CmdRd_Req_Idle_Time_Threshold is a threshold to the idle time of the read request fifo queue; and
      IV. CmdRd_Line_Hit is active, wherein a signal CmdRd_Line_Hit is used to monitor a plurality of read hit signals, and when the plurality of read hit signals occur, the signal CmdRd_Line_Hit is active; and
    performing the second sub-judgment step to determine that the command write request has priority over the command read request to be forwarded or the command read request has priority over the command write request to be forwarded.

8. The memory read/write arbitration method of claim 7, wherein the plurality of read hit signals comprise at least one general read hit, at least one graphic read hit, and at least one gart table read hit.

9. The memory read/write arbitration method of claim 7, wherein the judgment step further comprises performing a queue-checking step before the first sub-judgment step to determine that the command write request has priority over the command read request to be forwarded when the write request fifo queue is near full, and if the write request fifo queue is not near full, to perform the first sub-judgment step continuously.

10. The memory read/write arbitration method of claim 7, wherein the method further comprises performing a training step after performing the second sub-judgment step, and the training step comprises:
   I. To decrease the value of the parameter CmdRd_Req_Low_Threshold if an idle length in a command bus increases; and
   II. Using a moving average number to be the parameter CmdRd_Req_Pend_Cnt when the plurality of command read requests are inactive.

11. A memory read/write arbitration method utilized in a memory controller, comprising:
   providing an arbitrator;
   providing a read request fifo queue having a plurality of command read requests;
   providing a write request fifo queue having a plurality of command write requests;
   performing a judgment step to determine that a command write request of the plurality of command write requests has priority over a command read request of the plurality of command read requests to be forwarded or the command read request of the plurality of command read requests has priority over the command write request of the plurality of command write requests to be forwarded, wherein the judgment step comprises:
      performing a first sub-judgment step to obtain a signal Cmd_Wrt_Req_Mask, and the command read request has priority over the command write request to be forwarded when the signal Cmd_Wrt_Req_Mask is enabled, and otherwise, the command write request is forwarded to be performed a second sub-judgment step when the signal Cmd_Wrt_Req_Mask is not enabled under at least one of a plurality of first-step conditions that comprise:
         I. CmdWrt_Req_Cnt≧Wrt_Req_Cnt_High_Threshold, wherein a parameter CmdWrt_Req_Cnt is used to records a number of the plurality of command write requests, and a parameter Wrt_Req_Cnt_High_Threshold is a high threshold to the number of the plurality of command write requests;
         II. CmdRd_Req_Pend_Cnt<CmdRd_Req_Low_Threshold, wherein a parameter CmdRd_Req_Pend_Cnt is used to record a pending number of the plurality of command read requests, and a parameter CmdRd_Req_Low_Threshold is a low threshold to the pending number of the plurality of command read requests;
         III. CmdRd_Req_Idle_Timer>CmdRd_Req_Idle_Time_Threshold, wherein a parameter CmdRd_Req_Idle_Timer is used to count and record an idle time of the read request fifo queue, and a parameter CmdRd_Req_Idle_Time_Threshold is a threshold to the idle time of the read request fifo queue; and
         IV. CmdRd_Line_Hit is active, wherein a signal CmdRd_Line_Hit is used to monitor a plurality of read hit signals, and when the plurality of read hit signals occur, the signal CmdRd_Line_Hit is active; and
      performing the second sub-judgment step with the command write requests from the first sub-judgment step and the command read requests to obtain a signal Mem_Gnt_Wrt_Window, and the command read request has priority over the command write request from the first sub-judgment step to be forwarded when the signal Mem_Gnt_Wrt_Window is not enabled, and otherwise, the command write request from the first sub-judgment step has priority over the command read request to be forwarded when the signal Mem_Gnt_Wrt_Window is enabled under one of a plurality of second-step conditions that comprise:
         I. Continuous_CmdWrt_Low_Threshold<Continuous_CmdWrt_Number<Continuous_CmdWrt_High_Threshold and Page_Addr(Current CmdWrt_Req)==Page_Addr(Opened), wherein a parameter Continuous_CmdWrt_Number is used to record a number of a plurality of continuous command write requests in the plurality of command write requests, and a parameter Continuous_CmdWrt_High_Threshold is a high threshold to the number of the plurality of continuous command write requests, and a parameter Continuous_CmdWrt_Low_Threshold is a low threshold to the number of the plurality of continuous command write requests, and a parameter Page_Addr(Current CmdWrt_Req) is a page address accessed by a current command write request in the plurality of command write requests, and a parameter Page_Addr(Opened) is a page address opened by accesses of the plurality of command write requests and the plurality of command read requests previously; and
         II. Continuous_CmdWrt_Number<Continuous_CmdWrt_Low_Threshold.

12. The memory read/write arbitration method of claim 11, wherein the plurality of read hit signals comprise at least one general read hit, at least one graphic read hit, and at least one gart table read hit.

13. The memory read/write arbitration method of claim 11, wherein the judgment step further comprises performing a queue-checking step before performing the first sub-judgment step to determine that the command write request has priority over the command read request to be forwarded when the write request fifo queue is near full, and if the write request fifo queue is not near full, to perform the first sub-judgment step continuously.

14. The memory read/write arbitration method of claim 11, wherein the method further comprises performing a training step after performing the second sub-judgment step, and the training step comprises:
   I. To decrease the value of the parameter CmdRd_Req_Low_Threshold if an idle length in a command bus increases; and
   II. Using a moving average number to be the parameter CmdRd_Req_Pend_Cnt when the plurality of command read requests are inactive.

* * * * *